(12) United States Patent
Nishimura et al.

(10) Patent No.: US 7,020,169 B2
(45) Date of Patent: Mar. 28, 2006

(54) LASER DIODE DRIVER WITH EXTINCTION RATIO CONTROL

(75) Inventors: Kazuko Nishimura, Kyoto (JP); Hiroshi Kimura, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 231 days.

(21) Appl. No.: 10/648,513

(22) Filed: Aug. 27, 2003

(65) Prior Publication Data

US 2004/0042514 A1 Mar. 4, 2004

(30) Foreign Application Priority Data

Sep. 3, 2002 (JP) ............................. 2002-257860

(51) Int. Cl.
*H01S 3/00* (2006.01)
(52) U.S. Cl. ................................ 372/38.02; 347/237
(58) Field of Classification Search ............. 372/38.02
See application file for complete search history.

(56) References Cited

U.S. PATENT DOCUMENTS 4,729,035 A * 3/1988 Tanioka ..................... 382/237
5,488,621 A * 1/1996 Slawson et al. .............. 372/31
5,710,750 A * 1/1998 Tachibana ................ 369/59.16
6,259,466 B1 * 7/2001 Oomura et al. ............. 347/237
6,590,686 B1 * 7/2003 Sekiya et al. ............... 398/183

FOREIGN PATENT DOCUMENTS

JP          6-164049          6/1994

* cited by examiner

*Primary Examiner*—James Vannucci
(74) *Attorney, Agent, or Firm*—McDermott Will & Emery LLP

(57) ABSTRACT

Included are a light-emitting circuit having a laser diode (LD); an LD drive circuit for driving the light-emitting circuit; a bias circuit for adding a bias current to a pulse current outputted from the LD drive circuit; a light-receiving circuit for receiving monitoring light outputted from the light-emitting circuit; an I/V conversion circuit for subjecting an output from the light-receiving circuit to current-to-voltage conversion; a maximum-value detection circuit and an average-value detection circuit for respectively detecting the maximum and minimum values of an output voltage of the I/V conversion circuit; a first comparator for comparing the detected maximum value with a first reference value to feed back the comparison result to the LD drive circuit; and a second comparator for comparing the detected average value with a second reference value to feed back the comparison result to the bias circuit.

11 Claims, 12 Drawing Sheets

LASER DIODE DRIVER WITH EXTINCTION RATIO CONTROL

BACKGROUND OF THE INVENTION

The present invention relates to APC (automatic power control) laser diode driver capable of extinction-ratio control.

Laser modules which include a light-emitting circuit having a laser diode (LD) and a light-receiving circuit having a photodiode (PD) are known in the field of optical communication. The LD of the light-emitting circuit produces a predetermined optical output power when a bias current is added to a pulse current which is responsive to input data, and also outputs monitoring light for APC. The PD of the light-receiving circuit receives the monitoring light outputted from the LD and performs light-to-current conversion. Based on the current resulting from the conversion, the magnitude of the bias current and that of the pulse current of the PD are controlled so that constant optical output power and a constant extinction ratio are obtained.

As is well known in the art, temperature variation, process variation, and deterioration caused by an extended period of use, for example, produce variation in the threshold current and conversion efficiency of LDs. In addition, the characteristics of LDs, such as the threshold current, conversion efficiency and variation thereof with temperature, differ completely depending on the manufacture and type of the LD. The LD-to-PD coupling efficiency also varies. In order to obtain optical output power and an extinction ratio which are always constant, the magnitude of the bias current and that of the pulse current have to be initialized appropriately and also has to be optimized at all times according to the conditions of use.

Hereinafter, temperature-variation-induced fluctuation in the threshold current and conversion efficiency of an LD will be described referring to FIGS. 1 through 3.

In FIG. 1, an example of case in which a conventional LD is driven at room temperature (T2), among low temperature (T1), room temperature (T2) and high temperature (T3), is indicated by a solid line representing its current-to-light conversion characteristic (I-P characteristic) 12. In FIG. 1, the character I represents an input current (drive current) into the LD and the character P indicates the optical output power of the LD, while the inclination of the I-P characteristic represents its conversion efficiency. At the room temperature, the threshold current of the LD is Ith2, while a bias current Ib is set equal to the threshold current Ith2 (Ib=Ith2). And a pulse current Ip responsive to input data is superimposed on the bias current Ib. In this case, when the pulse current Ip with a duty ratio of 1 to 1 (high period:low period) is applied to the LD, the LD exhibits a desired high extinction ratio (Pmax/Pmin) such as shown in FIG. 1, and at the same time a maximum optical output power Pmax and a minimum optical output power Pmin show a duty ratio of 1 to 1.

In FIG. 2, an example of case in which the conventional LD is driven at the high temperature (T3) is indicated by a solid line representing its I-P characteristic 13. At the high temperature, the threshold current of the LD changes to Ith3 (>Ith2), while the conversion efficiency thereof becomes lower than at the room temperature. However, if the same bias current Ib (=Ith2) and pulse current Ip as those at the room temperature (T2) are still being applied to the LD, the maximum value of the optical output power P decreases to cause the extinction ratio to deteriorate, as can be seen from the illustrated maximum optical output power Pmax3 and minimum optical output power Pmin3. Further, the duty ratio of the optical output power P deteriorates considerably.

In FIG. 3, an example of case in which the conventional LD is driven at the low temperature (T1) is indicated by a solid line representing its I-P characteristic 11. At the low temperature, the threshold current of the LD changes to Ith1 (>Ith2), while the conversion efficiency thereof becomes higher than at the room temperature. However, if the same bias current Ib (=Ith2) and pulse current Ip as those at the room temperature (T2) are still being applied to the LD, the maximum and minimum values of the optical output power P both rise, as can be seen from the illustrated maximum and minimum optical output powers Pmax1 and Pmin1, thereby also causing deterioration in the extinction ratio.

As described above, the bias current Ib smaller than the threshold current Ith3 as shown in FIG. 2 results in the heavy deterioration in the maximum optical output power, extinction ratio and duty ratio. On the other hand, when the bias current Ib exceeds the threshold current Ith1 as shown in FIG. 3, the extinction ratio deteriorates considerably. In any of these cases, a problem arises in that the communication cannot be performed smoothly, for example.

FIG. 4 illustrates an example of case in which an LD is driven in an ideal manner such that the maximum optical output power, extinction ratio and duty ratio are all kept constant regardless of the ambient temperature. Specifically, at the high temperature (T3), the bias current is raised to Ib3 (=Ith3) in response to the increase in the threshold current from Ith2 to Ith3, while the pulse current is increased to Ip3 in accordance with the decrease in the conversion efficiency. At the low temperature (T1), the bias current is reduced to Ib1 (=Ith1) in response to the decrease in the threshold current from Ith2 to Ith1, while the pulse current is decreased to Ip1 in accordance with the increase in the conversion efficiency. These adjustments in the currents allow the maximum and minimum optical output powers Pmax and Pmin as those achieved at the room temperature (T2) to be always obtained irrespective of the ambient temperature.

In order to drive LDs in such an ideal manner, various attempts have been made. Those attempts include a conventional technique in which a beam of monitoring light outputted from an LD is subjected to light-to-electricity conversion performed by a PD, and the resultant electric signal outputted from the PD is inputted into an average-value detection circuit and a peak-value detection circuit. The average-value output voltage and peak-value output voltage outputted from the detection circuits are applied to an operation circuit where a voltage which is proportional to the difference between a voltage which is twice the average-value output voltage and the peak-value output voltage is generated and then fed back to a reference-voltage setting terminal or a bias-current control terminal of a laser drive circuit. At the same time, the average-value output voltage is fed back to a pulse-current control terminal of the laser drive circuit. In this manner, the conventional technique achieves the definite amplitude, upper and lower symmetry and extinction ratio of the optical output power waveform (see Japanese Laid-Open Publication No. 6-164049).

The conventional technique, which permits the average optical output power to be constant, however, has a problem because the difference between the voltage which is twice the average-value output voltage and the peak-value output voltage is controlled to be zero based on the assumption that the minimum optical output power is equal to zero, but the minimum optical output power (≠0) actually exists and produces a corresponding offset which has adverse effect.

In the known technique, in the case of a bias current greater than the threshold current, although the average optical output power is equal to a reference value, there is a possibility that the duty ratio of the optical output power would not be 1 to 1 and that a state of equilibrium would be achieved when the difference between the voltage which is twice the average-value output voltage and the peak-value output voltage is zero. In such a case, the desired maximum optical output power, extinction ratio and duty ratio might not be obtained

SUMMARY OF THE INVENTION

It is therefore an object of the present invention to provide a laser diode driver which is capable of controlling the maximum optical output power, extinction ratio and duty ratio of an LD in such a manner as to keep them always constant by optimizing a bias current and a pulse current applied to the LD even when variation is produced in the threshold current and conversion efficiency of the LD due to temperature variation, process variation or deterioration caused by an extended period of use, for example.

To achieve the object, a first inventive laser diode driver with extinction ratio control includes: a light-emitting circuit; a drive circuit for driving the light-emitting circuit; a bias circuit for adding a bias current to a pulse current outputted from the drive circuit; a light-receiving circuit for receiving monitoring light outputted from the light-emitting circuit; an I/V conversion circuit for subjecting an output from the light-receiving circuit to current-to-voltage conversion; a maximum-value detection circuit for detecting the maximum value of an output voltage of the I/V conversion circuit; an average-value detection circuit for detecting the average value of the output voltage of the I/V conversion circuit; a first comparator for comparing the maximum value with a first reference value to feed back the comparison result to the drive circuit; and a second comparator for comparing the average value with a second reference value to feed back the comparison result to the bias circuit.

A second inventive laser diode driver with extinction ratio control includes: a light-emitting circuit; a drive circuit for driving the light-emitting circuit; a bias circuit for adding a bias current to a pulse current outputted from the drive circuit; a light-receiving circuit for receiving monitoring light outputted from the light-emitting circuit; an I/V conversion circuit for subjecting an output from the light-receiving circuit to current-to-voltage conversion; a maximum-value detection circuit for detecting the maximum value of an output voltage of the I/V conversion circuit; a duty detection circuit for detecting the duty ratio of the output voltage of the I/V conversion circuit to feed back the detected duty ratio to the bias circuit; and a comparator for comparing the maximum value with a first reference value to feed back the comparison result to the drive circuit.

DESCRIPTION OF THE PREFERRED EMBODIMENTS

Figure 5:
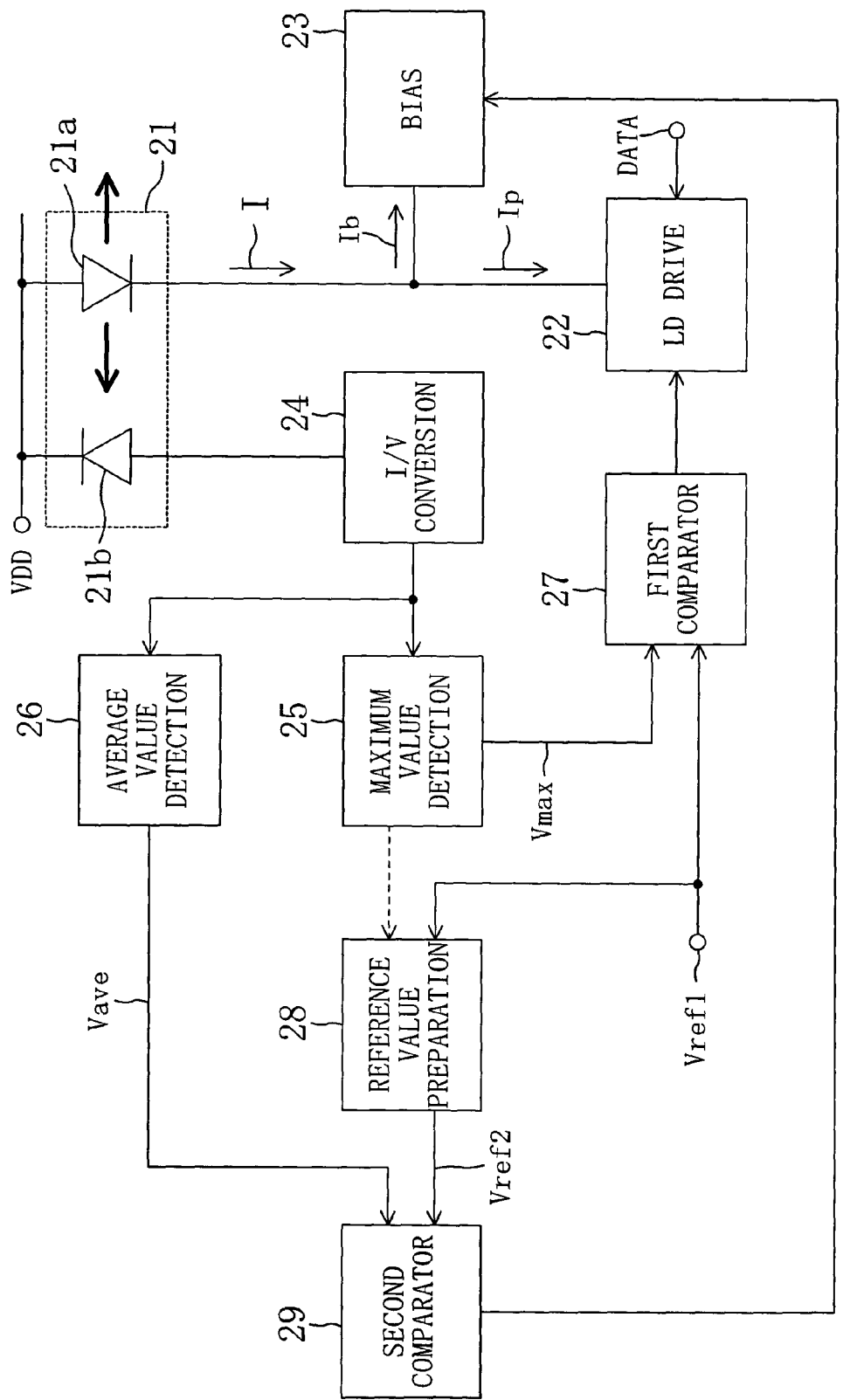
FIG. 5 is a block diagram of a laser diode driver in accordance with a first embodiment of the present invention.

FIG. 5 is a block diagram of a laser diode driver with extinction ratio control in accordance with a first embodiment of the present invention. In FIG. 5, the reference numeral 21 denotes a laser module which includes a light-emitting circuit 21a and a light-receiving circuit 21b. The light-emitting circuit 21a is composed of a laser diode (LD) which produces a predetermined optical output power and also performs current-to-light conversion in order to output monitoring light for APC. The light-receiving circuit 21b is composed of a photodiode (PD) for receiving the monitoring light outputted from the light-emitting circuit 21a. The reference numeral 22 denotes an LD drive circuit, 23 denotes a bias circuit, 24 denotes an I/V conversion circuit, 25 denotes a maximum value detection circuit, 26 denotes an average value detection circuit, 27 denotes a first comparator, 28 denotes a reference value preparation circuit, and 29 denotes a second comparator.

The LD drive circuit 22 supplies a pulse current Ip to drive the light-emitting circuit 21a in accordance with input data (DATA). The bias circuit 23 adds a bias current Ib to the pulse current Ip outputted from the LD drive circuit 22. In other words, the input current (drive current) I into the light-emitting circuit 21a is equal to Ib+Ip. The I/V conversion circuit 24 subjects an output from the light-receiving circuit 21b to current-to-voltage conversion. The maximum value detection circuit 25 detects the maximum value Vmax of the output voltage of the I/V conversion circuit 24. The average value detection circuit 26 detects the average value Vave of the output voltage of the I/V conversion circuit 24. The first comparator 27 compares the maximum value Vmax outputted from the maximum value detection circuit 25 with a predetermined first reference value (first reference voltage) Vref1 and feeds back the comparison result to the LD drive circuit 22 so as to make the difference therebetween zero, thereby charging or discharging the pulse current Ip. The reference value preparation circuit 28 generates a second reference value (second reference voltage) Vref2 from the first reference value Vref1. The second comparator 29 makes a comparison between the average value Vave outputted from the average value detection circuit 26 and the second reference value Vref2 to feed back the comparison result to the bias circuit 23 so as to make the difference therebetween zero, thereby charging or discharging the bias current Ib.

Figure 4:
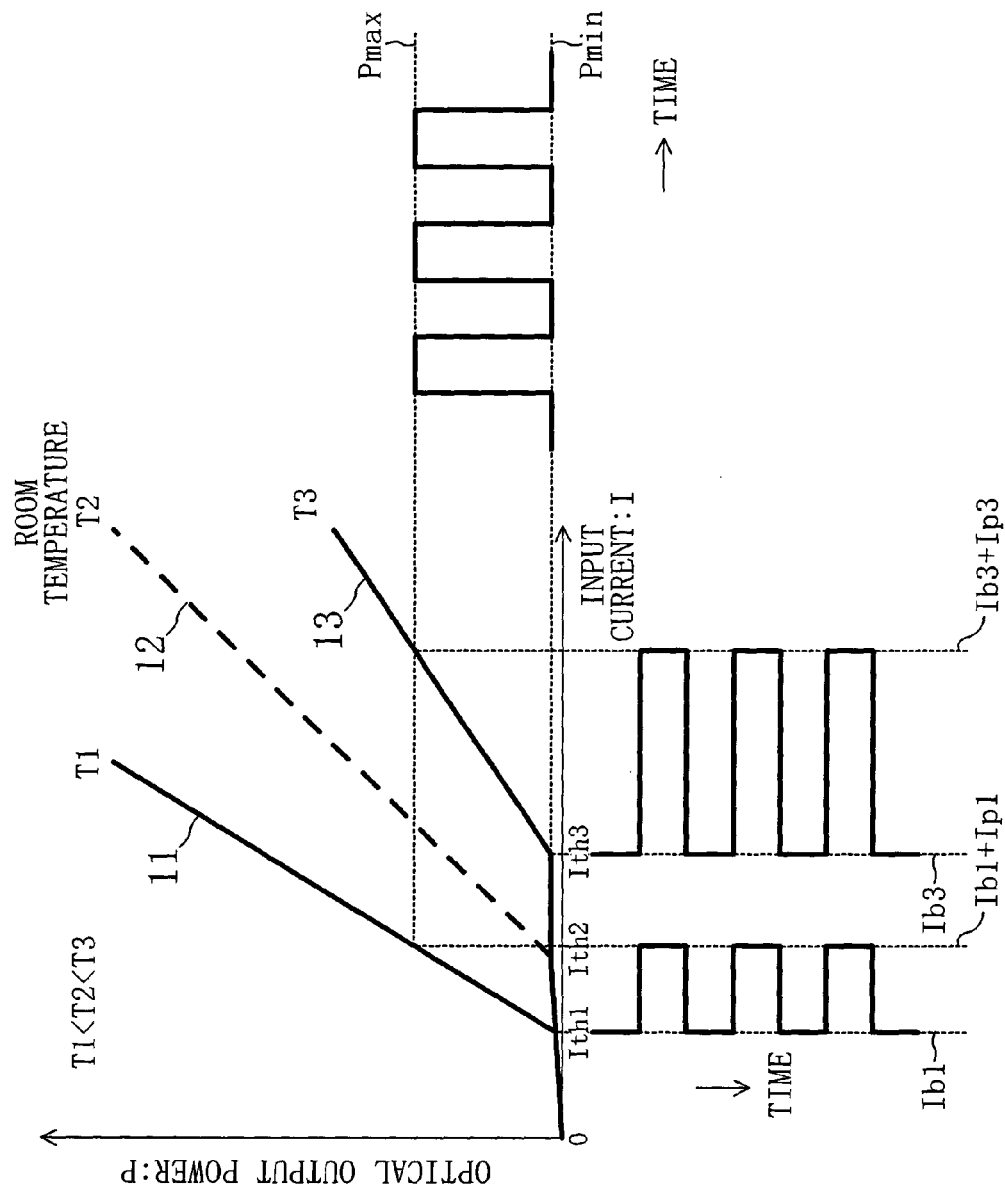
FIG. 4 is a characteristic diagram representing an example of case in which an LD is driven in an ideal manner such as allowing the maximum optical output power, extinction ratio and duty ratio which are all constant to be obtained regardless of the ambient temperature.

In the structure shown in FIG. 5, by equalizing the maximum value Vmax with the reference value Vref1, the maximum optical output power Pmax is kept constant as shown in FIG. 4 no matter whether the threshold current and conversion efficiency of the LD are large or small, while the extinction ratio and duty radio are also allowed to be kept constant at all times as shown in FIG. 4 because the two feedback loops make the maximum value Vmax and the average value Vave agree with the reference values Vref1 and Vref2, respectively. Furthermore, since the duty ratio of the input data (DATA) is not changed in the configuration shown in FIG. 5, the duty ratio of the optical output power does not deteriorate easily even in the case where the conversion efficiency of the LD has varied considerably.

Figure 6:
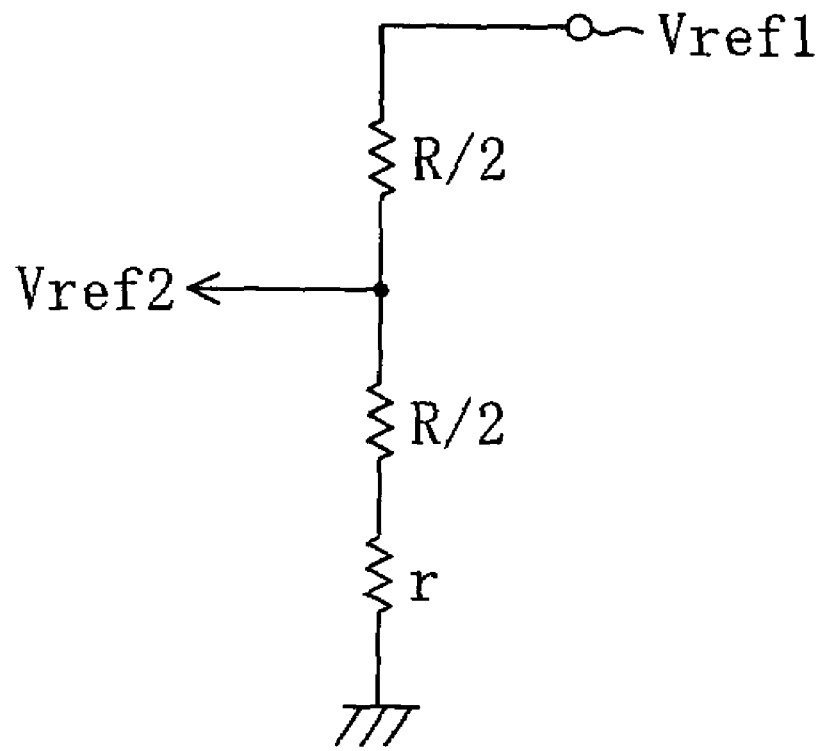
FIG. 6 is a circuit diagram illustrating an exemplary configuration of a reference value preparation circuit shown in FIG. 5.

FIG. 6 illustrates an exemplary configuration of the reference value preparation circuit 28 shown in FIG. 5, and specifically indicates how the second reference value Vref2 is produced. Given that the maximum and minimum values of the output voltage of the I/V conversion circuit 24 are Vmax and Vmin, respectively, a constant extinction ratio is achieved by keeping the Vmax-Vmin ratio constant. When Vmax is equalized with Vref1 for this purpose as described above, Vmin is determined based on Vmax, while Vave is determined to be an intermediate value between Vmax and Vmin. Therefore, the following definition holds: Vmax: Vmin=R+r:r=constant, and the reference value, i.e., the second reference value Vref2 for the average value Vave can be established by the equation: Vref2=Vmax×{(R/2)+r}/(R+r), that is, by the resistance-division method. It should be however noted that any methods other than the resistance-division method may be employed so long as such methods can produce the desired reference value.

The second reference value Vref2 may be generated according to the first reference value Vref1 as is indicated in FIG. 5 by the solid line representing the first reference value Vref1 that enters the reference value preparation circuit 28, or may be produced based on the detected maximum value Vmax as is shown in FIG. 5 by the broken line going from the maximum value detection circuit 25 to the reference value preparation circuit 28. It should be however understood that if the maximum value Vmax and the average value Vave are fed back at the same time, a long convergence time is necessary to reach equilibrium. The second reference value Vref2 therefore should be generated based on the predetermined first reference value Vref1. Then, the maximum value Vmax and the average value Vave are both optimized with respect to the fixed first reference value Vref1, as a result of which a shorter convergence time is expected.

Figure 1:
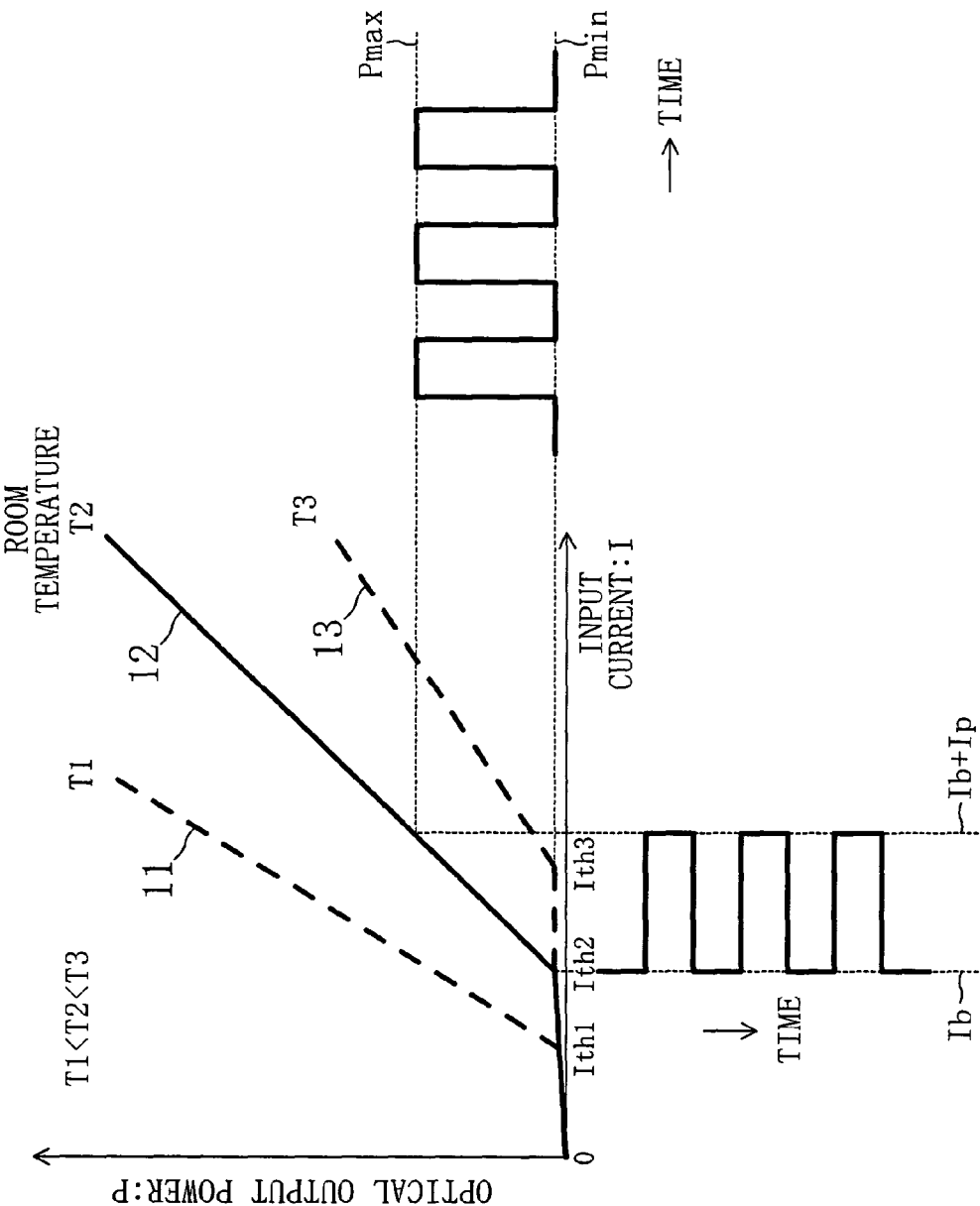
FIG. 1 is a characteristic diagram indicating an example of case in which a conventional LD is driven at room temperature.
Figure 7:
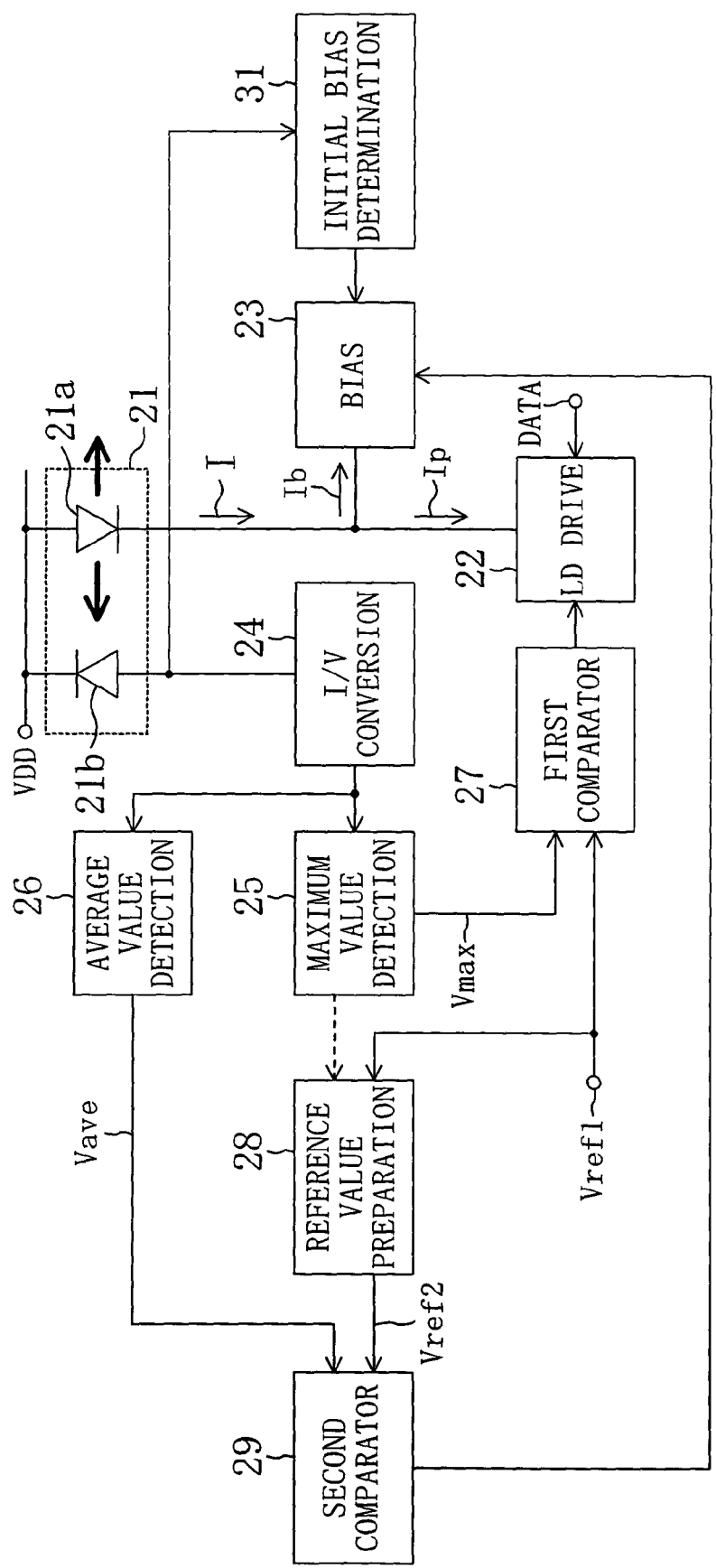
FIG. 7 is a block diagram illustrating a first modified example of the configuration shown in FIG. 5.

FIG. 7 illustrates a first modified example of the configuration shown in FIG. 5. A laser diode driver shown in FIG. 7 includes an initial bias determination circuit 31 in addition to the configuration shown in FIG. 5. The initial bias determination circuit 31 automatically sets an optimum initial bias value for the bias circuit 23 in accordance with the initial state. Specifically, respective currents Ib−α, Ib, and Ib+α (α>0) are inputted into the light-emitting circuit 21a, and the initial bias determination circuit 31 monitors the respective resultant output currents of the light-receiving circuit 21b. Since I-P characteristics (for example, the characteristic 12 shown in FIG. 1) have a point at which they bend, the bias current value is continuously changed to detect the extent of variation (first variation) between the output currents resulting from Ib−α and Ib and the extent of variation (second variation) between the output currents resulting from Ib and Ib+α. If the first and second variations differ from each other, the current which has created such a situation is considered to be substantially equal to the threshold current Ith of the LD and is therefore set as the initial bias current Ib. This gives the initial bias current Ib that is almost equal to the threshold current Ith. It is thus possible to automatically establish an initial bias current suitable for each LD, which consequently achieves a simplified checking process as well as reduction in the product cost.

It should be noted that as the value of α decreases, the initial bias current Ib can be established more accurately. The number of input points may be three or more, or the threshold current Ith may be computed based on two or more input points. Any methods may be used as long as the threshold current Ith can be obtained by such methods. In the process of monitoring the outputs from the light-receiving circuit 21b when the currents Ib−α, Ib, and Ib+α are inputted into the light-emitting circuit 21a, the signals of either the output currents of the light-receiving circuit 21b or the output voltages of the I/V conversion circuit 24 may be monitored.

Figure 8:
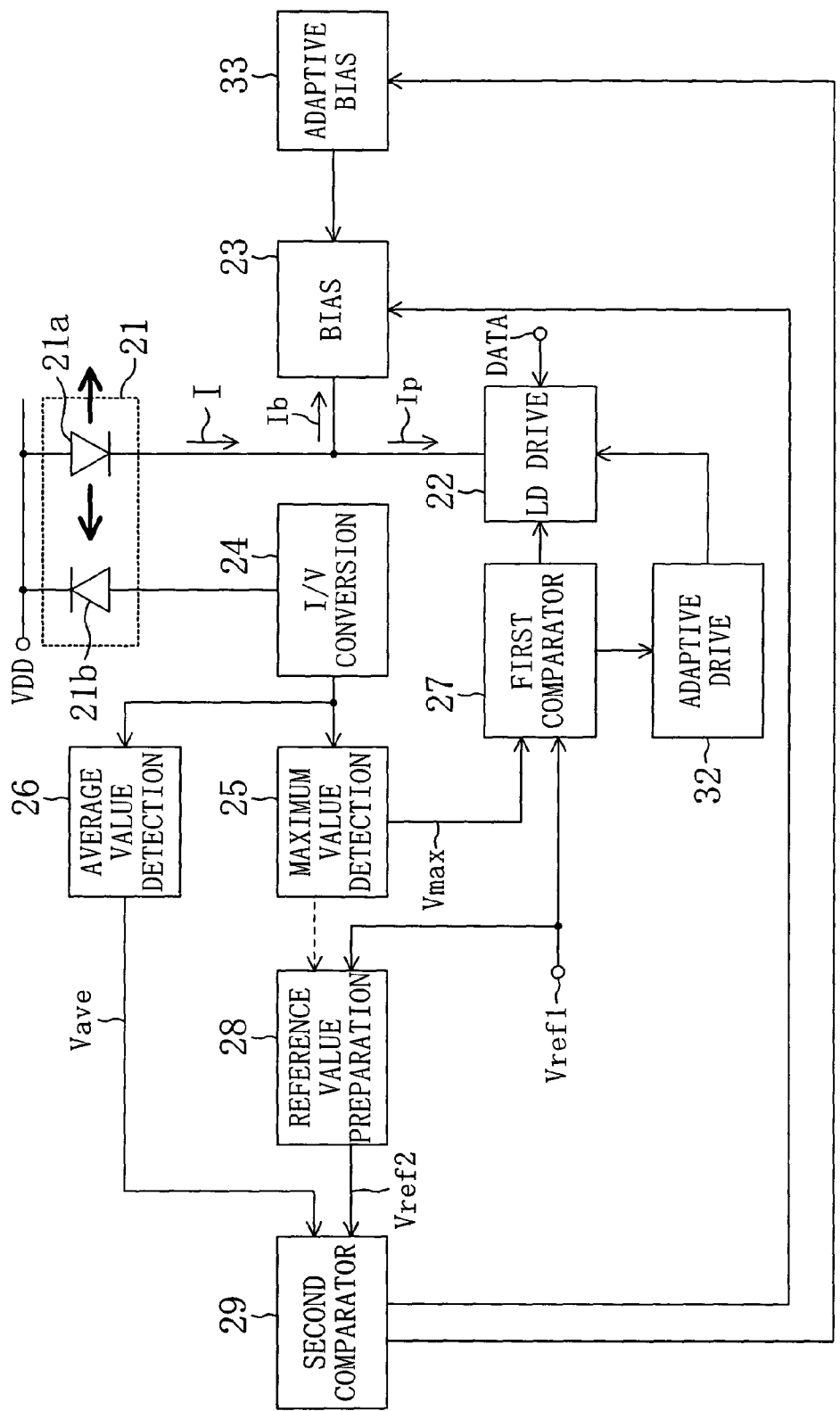
FIG. 8 is a block diagram illustrating a second modified example of the configuration shown in FIG. 5.

FIG. 8 illustrates a second modified example of the configuration shown in FIG. 5. A laser diode driver shown in FIG. 8 is obtained by adding an adaptive drive circuit 32 and an adaptive bias circuit 33 to the structure shown in FIG. 5. At the time of the initial settings, or when the ambient temperature has sharply changed, or when deterioration in the LD and the other members has proceeded, the threshold current and conversion efficiency of the LD may vary rapidly. In such a case, even the configuration shown in FIG. 5 allows optimization to be implemented, however, convergence to an optimum value takes time. Therefore, in the case of a variation more than a certain extent, the first comparator 27 outputs a signal indicating the rapid variation, and the adaptive drive circuit 32, upon receiving the signal, induces the LD drive circuit 22 to sharply charge/discharge the pulse current Ip. The second comparator 29 outputs a signal indicating the sudden variation, and the adaptive bias circuit 33, which has received the signal, causes the bias circuit 23 to rapidly charge/discharge the bias current Ib. As mentioned above, the adoption of the structure shown in FIG. 8 allows for the highly-precise high-speed optimization even when rapid variation of the LD characteristics occurs. It should be understood that the adaptive circuits 32 and 33 may be both used at the same time, or only one of them may be used.

Figure 9:
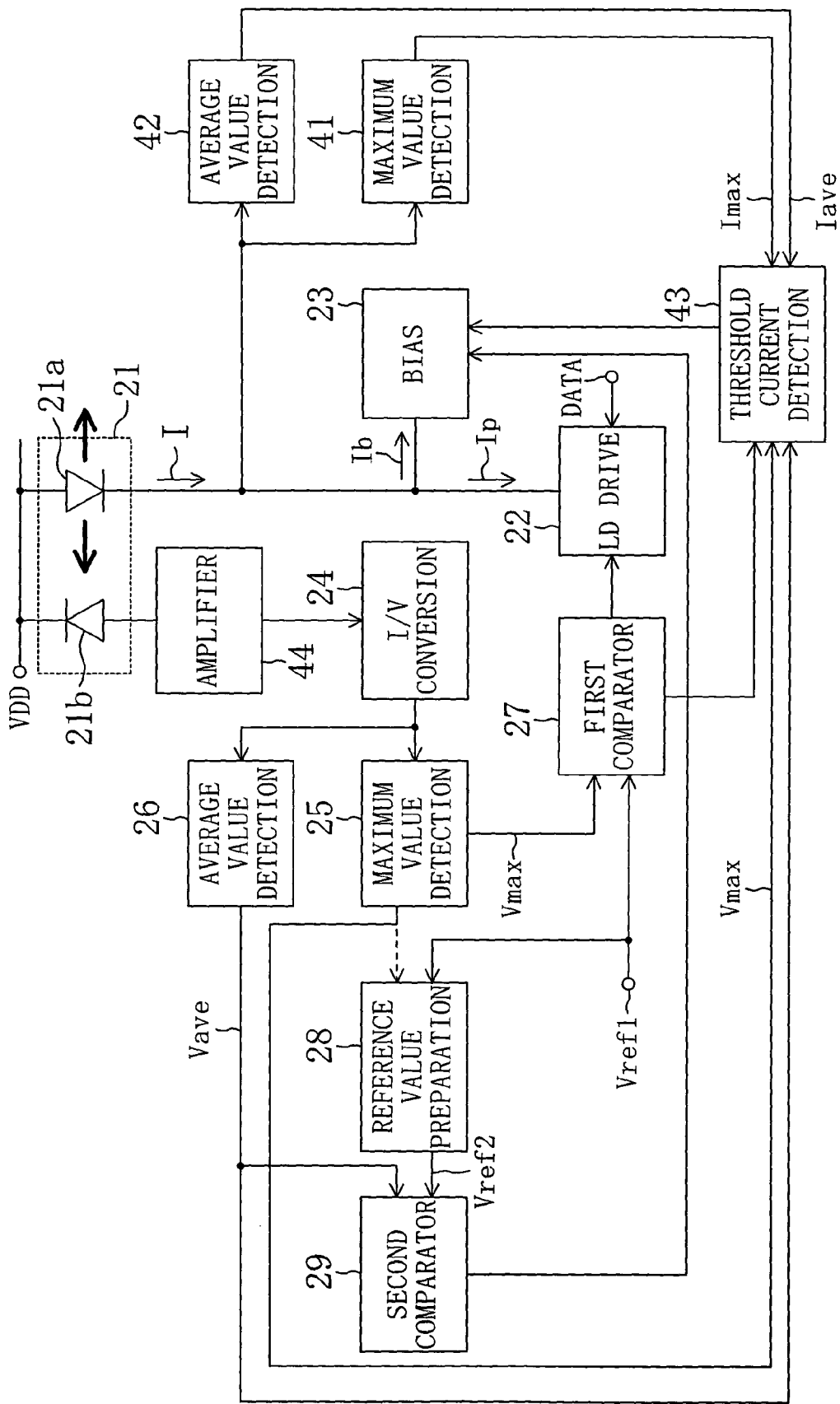
FIG. 9 is a block diagram illustrating a third modified example of the configuration shown in FIG. 5.

FIG. 9 illustrates a third modified example of the configuration shown in FIG. 5. A laser diode driver shown in FIG. 9 includes, in addition to the structure of FIG. 5, a threshold current detection circuit 43 and an amplifier circuit 44 as well as a maximum value detection circuit 41 for detecting the maximum value Imax of the LD drive current and an average value detection circuit 42 for detecting the average value Iave of the LD drive current. The threshold current detection circuit 43, if the maximum value Vmax of the output voltage of the I/V conversion circuit 24 is larger than the first reference value Vref1, receives a signal from the first comparator 27, performs a computation for obtaining a threshold current Ith based on the two maximum values Vmax and Imax and the two average values Vave and Iave, and then feeds back the result to the bias circuit 23. In order to increase the detection accuracy of the threshold current detection circuit 43, if the output current of the light-receiving circuit 21b is small, the amplifier circuit 44 amplifies the output current.

Figure 3:
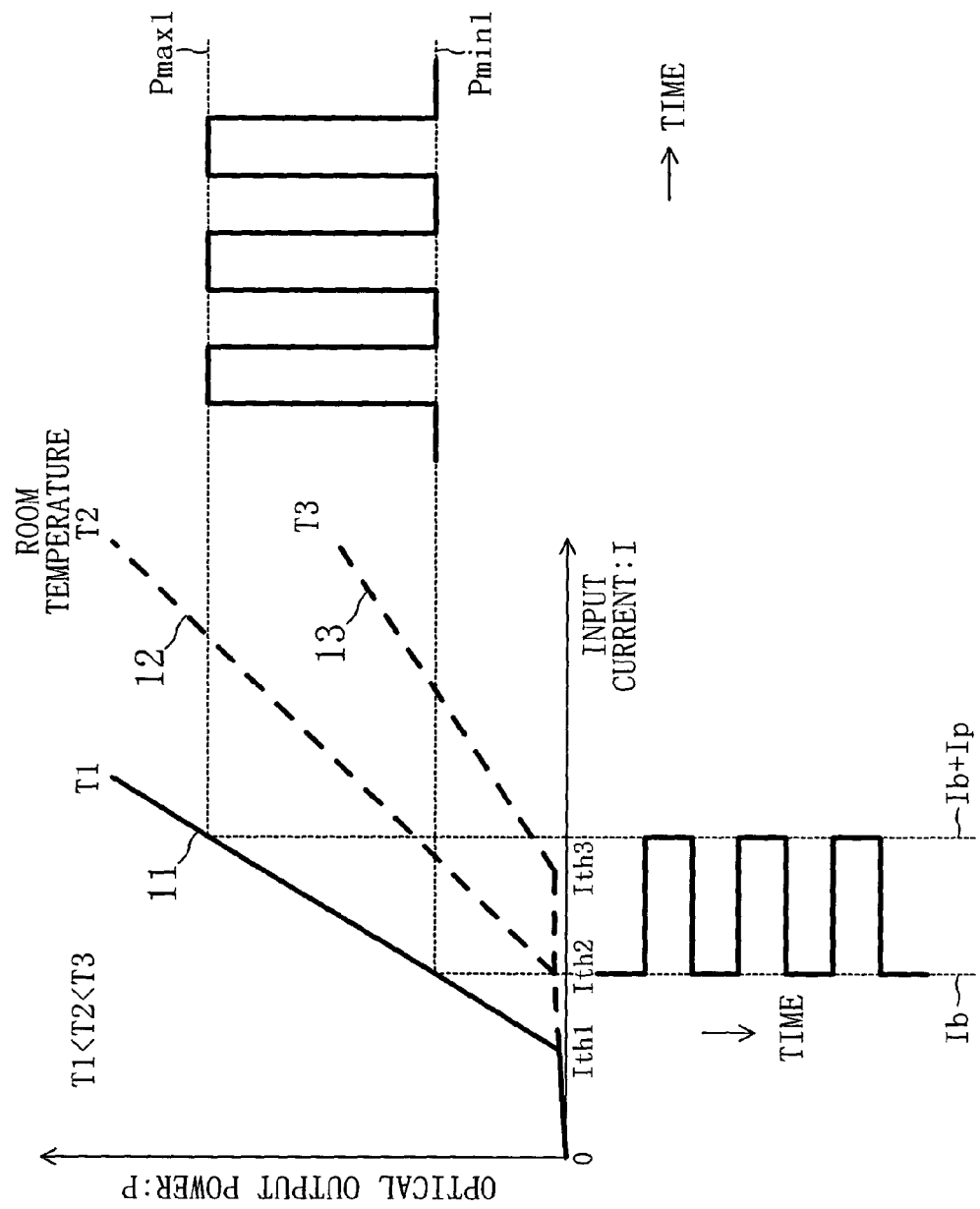
FIG. 3 is a characteristic diagram indicating an example of case in which the conventional LD is driven at low temperature.

In the case where a low ambient temperature, for example, has caused the threshold current Ith to decrease and the conversion efficiency to increase, the maximum and minimum optical output powers Pmax and Pmin both increase while the duty ratio of the output current of the light-receiving circuit 21b remains at 1 to 1, which results in deterioration in the extinction ratio (see FIG. 3). In such a case, convergence to an optimum value is achieved more rapidly by the following processes: the maximum value detector 25 equalizes Vmax with the first reference value Vref1, while at the same time the threshold current detection circuit 43 computes the threshold current Ith based on the two relationships between Vmax and Imax and between Vave and Iave, and feeds back the computed threshold current Ith to the bias current Ib of the bias circuit 23. If the input current (drive current) into the LD is equal to or larger than the threshold current Ith, the I-P characteristic may be approximately expressed by a linear equation, which allows the threshold current Ith to be obtained from any two points in the I-P characteristic. Adopting the structure in FIG. 9 enables the optimization of the bias current Ib at higher speed as compared with the configuration shown in FIG. 5. In computing the threshold current Ith, the I-P characteristic may be approximated with a linear equation as is mentioned above or may be approximated with a quadratic or higher-degree equation, or any other computation method may be employed.

Figure 10:
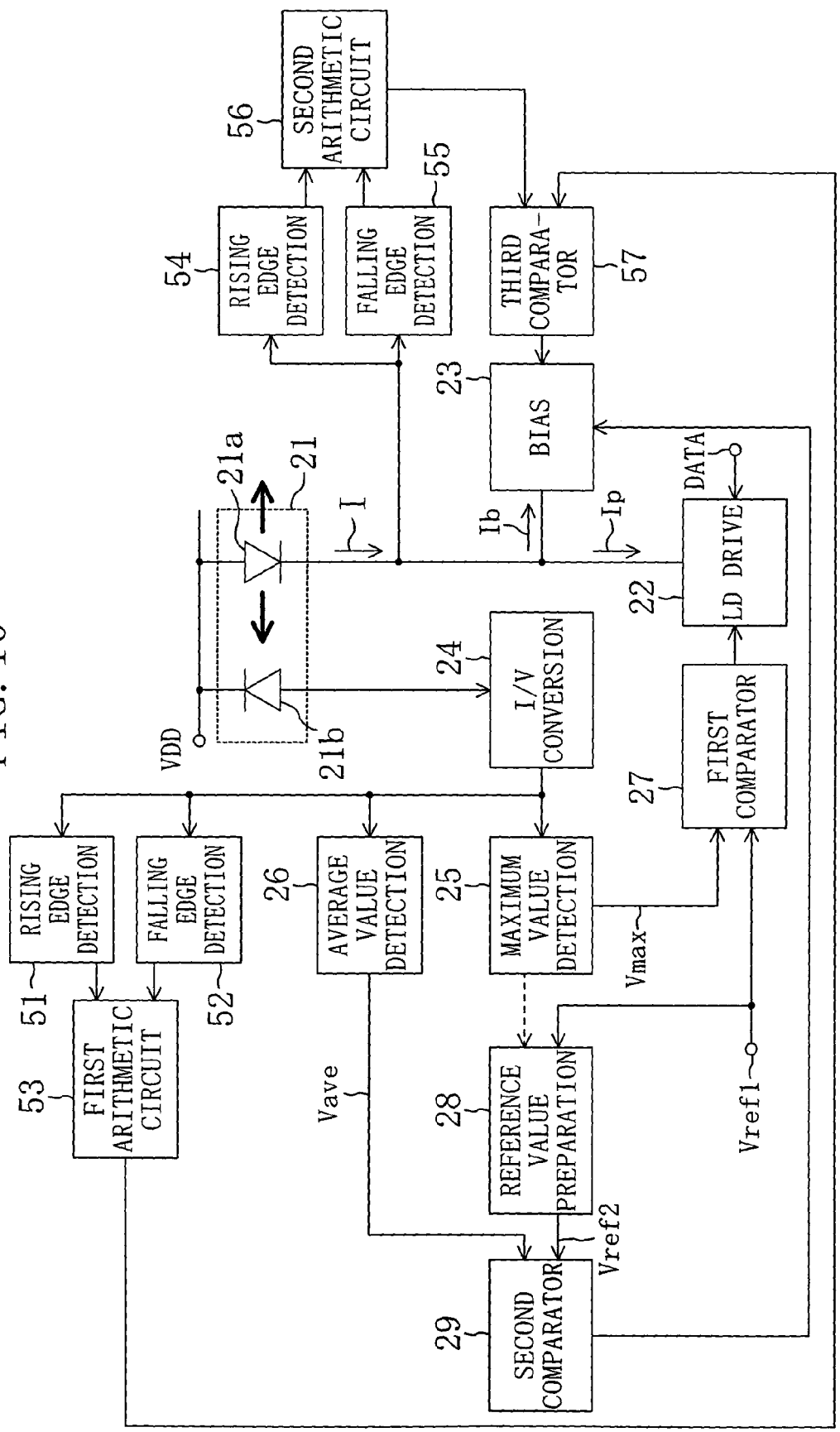
FIG. 10 is a block diagram illustrating a fourth modified example of the configuration shown in FIG. 5.

FIG. 10 illustrates a fourth modified example of the configuration shown in FIG. 5. A laser diode driver shown in FIG. 10 includes, in addition to the configuration shown in FIG. 5, a rising edge detection circuit 51, a falling edge detection circuit 52, a first arithmetic circuit 53, a rising edge detection circuit 54, a falling edge detection circuit 55, a second arithmetic circuit 56, and a third comparator 57. The rising edge detection circuit 51 detects the rising edge of the output voltage of the I/V conversion circuit 24. The falling edge detection circuit 52 detects the falling edge of the output voltage of the I/V conversion circuit 24. The first arithmetic circuit 53 computes the difference of time between the rising and falling edges of the output voltage. The rising edge detection circuit 54 detects the rising edge of the LD drive current I. The falling edge detection circuit 55 detects the falling edge of the LD drive current I. The second arithmetic circuit 56 computes the difference of time between the rising and falling edges of the LD drive current I. The third comparator 57 compares the output of the first arithmetic circuit 53 and the output of the second arithmetic circuit 56 and feeds back the comparison result to the bias circuit 23 to control the bias circuit 23 so as to obtain optical output with a constant duty ratio.

In the configuration in FIG. 10, the respective rising and falling edges of the input current into the light-emitting circuit 21a and of the output current of the light-receiving circuit 21b are detected for computing the respective amounts of time between the rising and falling edges. The computed time is fed back to the bias circuit 23, which makes it possible to obtain optical output with a constant duty ratio. Furthermore, the configuration shown in FIG. 10 permits the double feedback in the case of deterioration in the duty ratio such that convergence to an optimum value is achieved more rapidly as compared with the structure in FIG. 5. It should be noted that the detection of the rising and falling edges may be performed using a highly-accurate latch circuit, or may be processed by a software, for example, or any other structures capable of time detection may be used.

Figure 11:
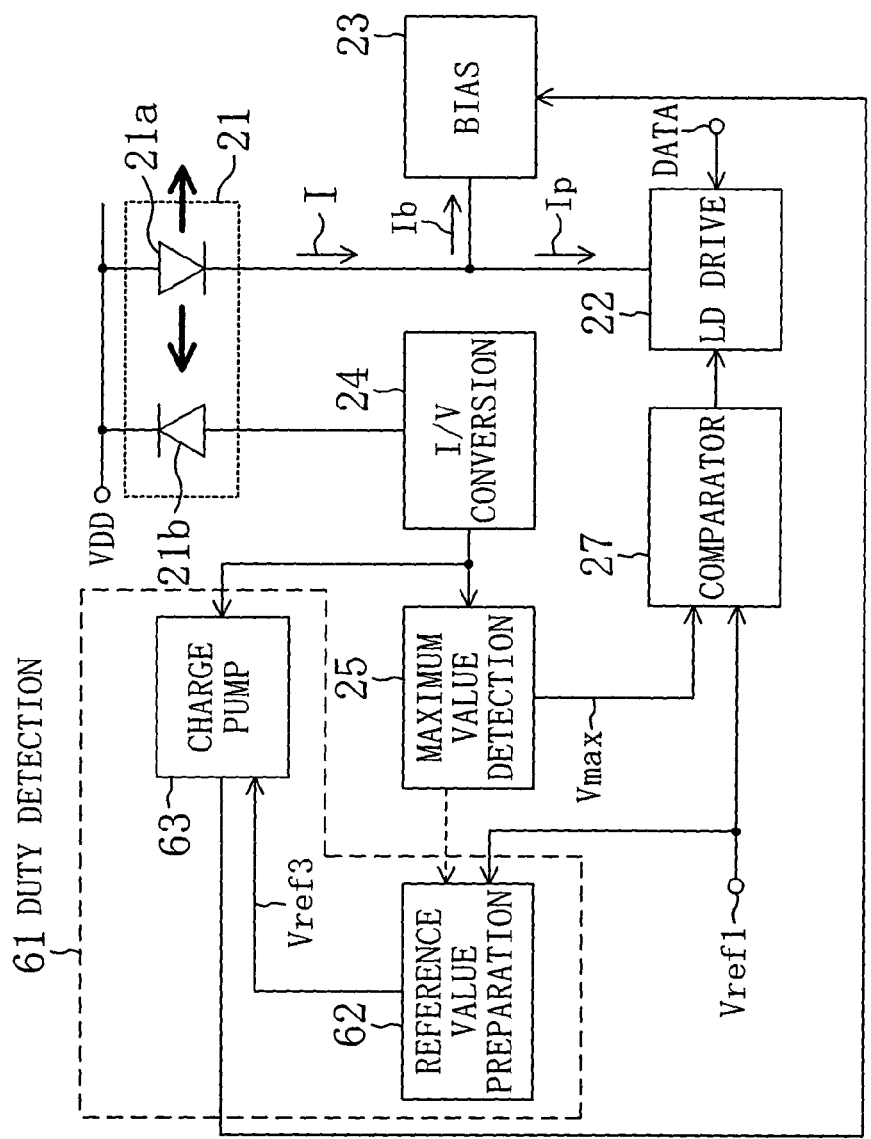
FIG. 11 is a block diagram illustrating a laser diode driver in accordance with a second embodiment of the present invention.

FIG. 11 is a block diagram illustrating a laser diode driver with extinction ratio control in accordance with a second embodiment of the present invention. In FIG. 11, the reference numeral 21 denotes a laser module which includes a light-emitting circuit 21a and a light-receiving circuit 21b. The light-emitting circuit 21a is composed of a laser diode (LD) which produces a predetermined optical output power and also performs current-to-light conversion to output monitoring light for APC. The light-receiving circuit 21b is composed of a photo diode (PD) for receiving the monitoring light outputted from the light-emitting circuit 21a. The reference numeral 22 denotes an LD drive circuit, 23 denotes a bias circuit, 24 denotes an I/V conversion circuit, 25 denotes a maximum value detection circuit, 27 denotes a comparator, and 61 denotes a duty detection circuit. The duty detection circuit 61 includes a reference value preparation circuit 62 and a charge pump circuit 63.

The LD drive circuit 22 supplies a pulse current Ip to drive the light-emitting circuit 21a in accordance with input data (DATA). The bias circuit 23 adds a bias current Ib to the pulse current Ip outputted from the LD drive circuit 22. Specifically, the input current (drive current) I into the light-emitting circuit 21a is equal to Ib+Ip. The I/V conversion circuit 24 subjects an output from the light-receiving circuit 21 to current-to-voltage conversion. The maximum value detection circuit 25 detects the maximum value Vmax of the output voltage of the I/V conversion circuit 24. The comparator 27 compares the maximum value Vmax outputted from the maximum value detection circuit 25 with a predetermined first reference value (first reference voltage) Vref1 and feeds back the comparison result to the LD drive circuit 22 so as to make the difference zero, thereby charging/discharging the pulse current Ip.

The duty detection circuit 61 detects the duty ratio of the output voltage of the I/V conversion circuit 24 to feed back the detected ratio to the bias circuit 23. The configuration shown in FIG. 11 utilizes characteristics in which the input voltage value of the charge pump circuit 63 increases or decreases depending on whether the output voltage of the I/V conversion circuit 24 is at a "high" period or a "low" period, and such voltage variation is fed back to the bias circuit 23 to finally allow the duty ratio of the optical output power to converge on a given value. The reference value preparation circuit 62 prepares from Vref1 a reference value (reference voltage) Vref3 for use as the threshold value for the "high" and "low" periods.

Figure 2:
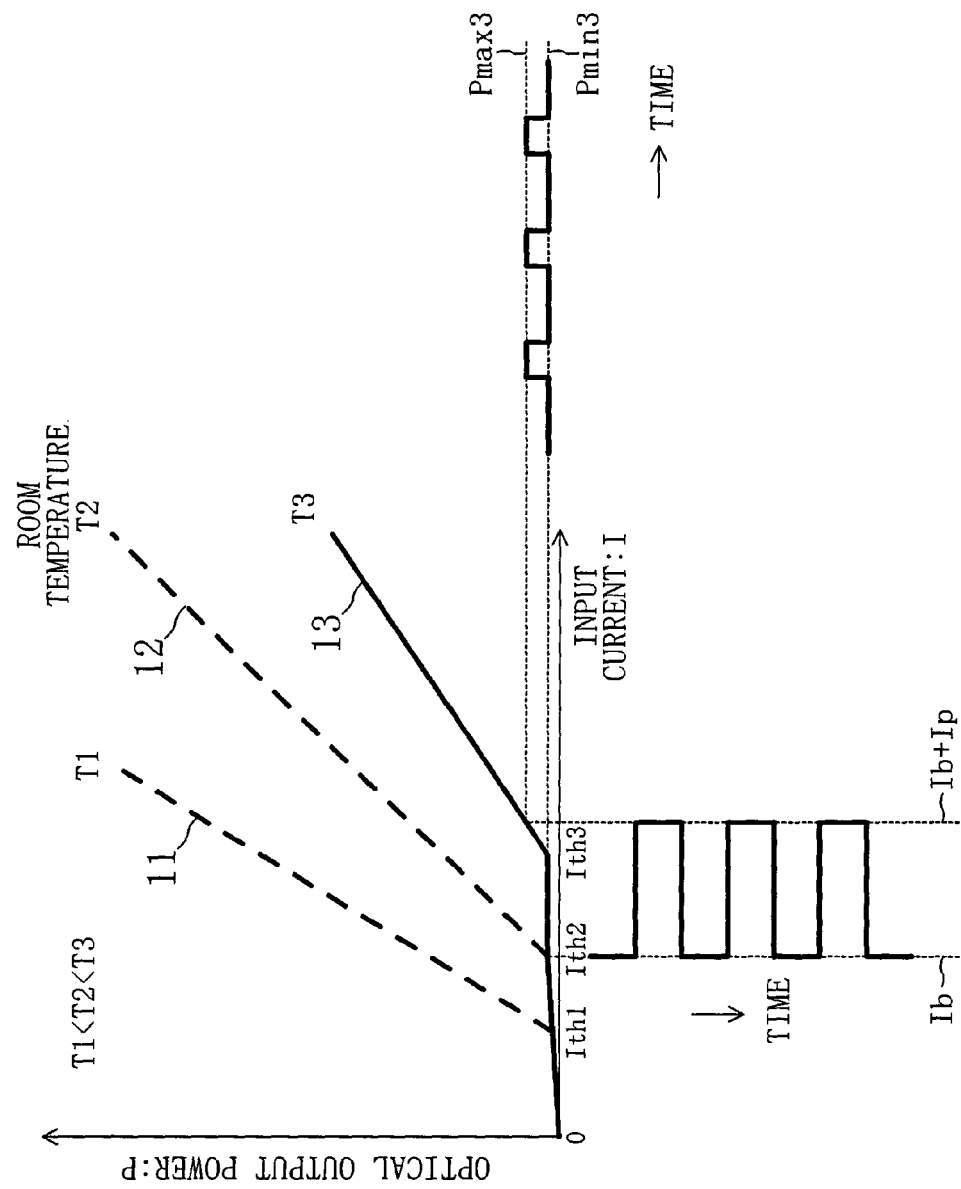
FIG. 2 is a characteristic diagram indicating an example of case in which the conventional LD is driven at high temperature.

In this embodiment, if the duty ratio detected by the duty detection circuit 61 is not 1 to 1, the duty detection circuit 61 performs a feedback to the bias circuit 23 in accordance with that ratio. Specifically, at a high temperature, the ratio of the "low" period increases as shown in FIG. 2. In such a case, the bias current Ib is increased so that the duty ratio of the optical output power is controlled to be 1 to 1.

As described above, with the configuration shown in FIG. 11, the maximum optical output power, the extinction ratio and the duty ratio are always kept constant in a simpler manner as compared with the configuration shown in FIG. 5. The duty-ratio detection may be performed by an A/D converter or a low-pass filter (LPF) circuit, or any other circuit structures capable of duty-ratio detection may be used.

Figure 12:
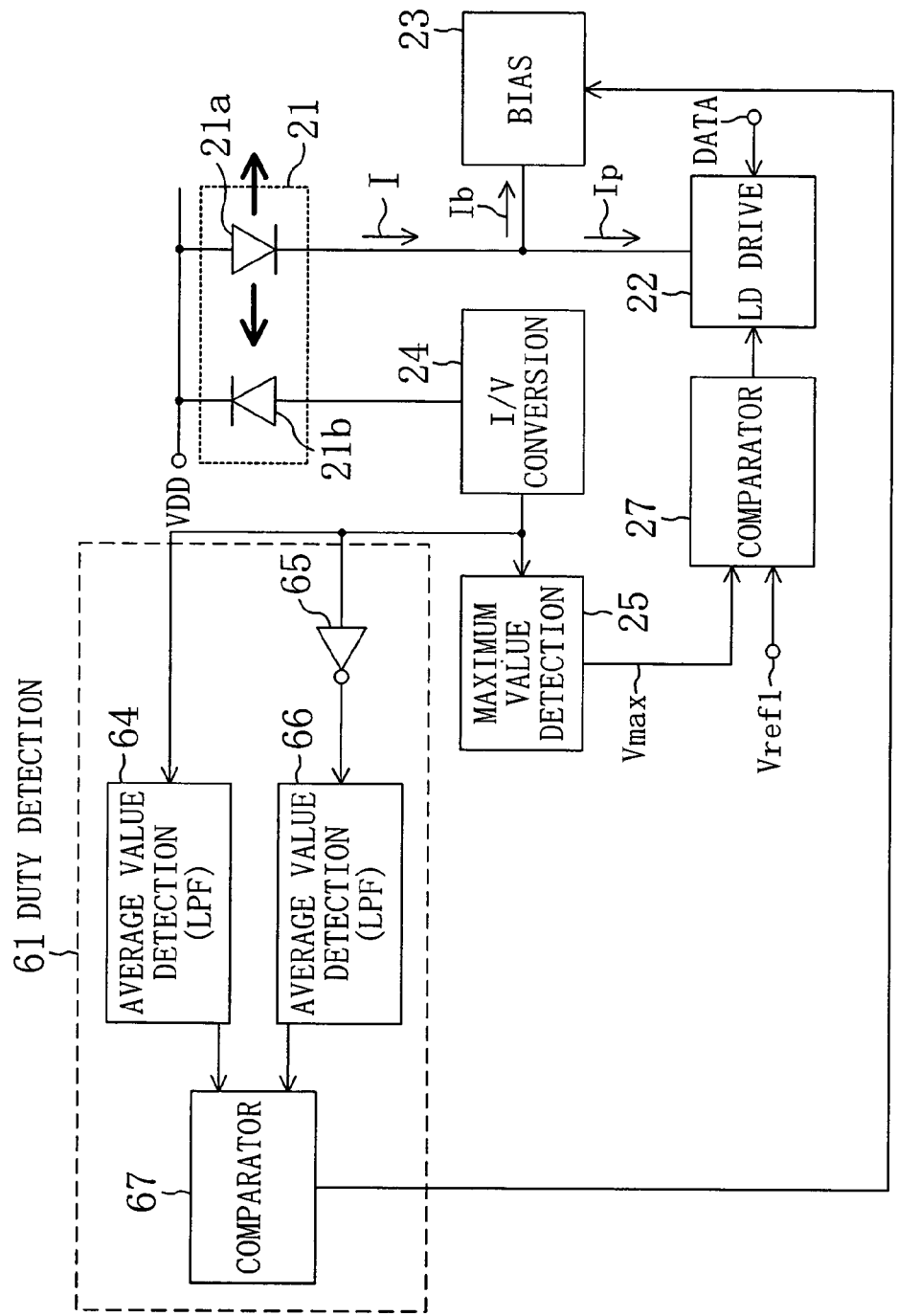
FIG. 12 is a block diagram illustrating a modified example of the configuration shown in FIG. 11.

FIG. 12 illustrates a modified example of the configuration shown in FIG. 11. In a laser diode driver shown in FIG. 12, a duty detection circuit 61 includes two average-value detection circuits 64 and 66, an inverter 65, and a comparator 67. The average value detection circuit 64 detects the average value of the non-inverted output voltage of the I/V conversion circuit 24, while the other average-value detection circuit 66 detects the average value of the inverted output voltage of the I/V conversion circuit 24. The comparator 67 compares outputs from the average-value detectors 64 and 66 to feed back the comparison result to the bias circuit 23. This configuration utilizes the fact that when the duty ratio is 1 to 1, the average value of the non-inverted output voltage is equal to the average value of the inverted output voltage. The average value detection circuits 64 and 66 may be easily configured using LPF circuits. It should be noted that any other circuit-structures capable of average-value detection may also be used.

What is claimed is:

1. A laser diode driver comprising:
a light-emitting circuit;
a drive circuit for driving the light-emitting circuit;
a bias circuit for adding a bias current to a pulse current outputted from the drive circuit;
a light-receiving circuit for receiving monitoring light outputted from the light-emitting circuit;
an I/V conversion circuit for subjecting an output from the light-receiving circuit to current-to-voltage conversion;
a maximum-value detection circuit for detecting the maximum value of an output voltage of the I/V conversion circuit;
an average-value detection circuit for detecting the average value of the output voltage of the I/V conversion circuit;
a first comparator for comparing the maximum value with a first reference value to feed back the comparison result to the drive circuit;
a second comparator for comparing the average value with a second reference value to feed back the comparison result to the bias circuit; and
a reference value preparation circuit for generating the second reference value from the first reference value or from the maximum value detected by the maximum-value detection circuit.

2. The laser diode driver of claim 1, further comprising an initial-bias determination circuit for automatically setting an optimum initial bias value for the bias circuit.

3. The laser diode driver of claim 1, further comprising an adaptive drive circuit for rapidly increasing/decreasing the pulse current if a difference between the maximum value detected by the maximum-value detection circuit and the first reference value is large.

4. The laser diode driver of claim 1, further comprising an adaptive bias circuit for rapidly increasing/decreasing the bias current if a difference between the average value detected by the average-value detection circuit and the second reference value is large.

5. A laser diode driver comprising:
a light-emitting circuit;
a drive circuit for driving the light-emitting circuit;
a bias circuit for adding a bias current to a pulse current outputted from the drive circuit;
a light-receiving circuit for receiving monitoring light outputted from the light-emitting circuit;
an I/V conversion circuit for subjecting an output from the light-receiving circuit to current-to-voltage conversion;
a maximum-value detection circuit for detecting the maximum value of an output voltage of the I/V conversion circuit;
an average-value detection circuit for detecting the average value of the output voltage of the I/V conversion circuit;
a first comparator for comparing the maximum value with a first reference value to feed back the comparison result to the drive circuit;
a second comparator for comparing the average value with a second reference value to feed back the comparison result to the bias circuit;
a maximum-value detection circuit for detecting the maximum value of a drive current of the light-emitting circuit;
an average-value detection circuit for detecting the average value of the drive current of the light-emitting circuit; and
a threshold-current detection circuit which, if the maximum value of the output voltage of the I/V conversion circuit is larger than the first reference value, receives a signal from the first comparator, computes a threshold current based on the two maximum values and the two average values, and feeds back the computed threshold current to the bias circuit.

6. The laser diode driver of claim 5, further comprising an amplifier circuit for amplifying the output current of the light-receiving circuit so as to increase the detection accuracy of the threshold-current detection circuit.

7. A laser diode driver comprising:
a light-emitting circuit;
a drive circuit for driving the light-emitting circuit;
a bias circuit for adding a bias current to a pulse current outputted from the drive circuit
a light-receiving circuit for receiving monitoring light outputted from the light-emitting circuit;
an I/V conversion circuit for subjecting an output from the light-receiving circuit to current-to-voltage conversion;
a maximum-value detection circuit for detecting the maximum value of an output voltage of the I/V conversion circuit;
an average-value detection circuit for detecting the average value of the output voltage of the I/V conversion circuit;
a first comparator for comparing the maximum value with a first reference value to feed back the comparison result to the drive circuit;
a second comparator for comparing the average value with a second reference value to feed back the comparison result to the bias circuit;
a first rising-edge detection circuit for detecting a rising edge of the output voltage of the I/V conversion circuit;
a first falling-edge detection circuit for detecting a falling edge of the output voltage of the I/V conversion circuit;
a first arithmetic circuit for computing a time difference between the rising and falling edges of the output voltage;
a second rising-edge detection circuit for detecting a rising edge of a drive current of the light-emitting circuit;
a second falling-edge detection circuit for detecting a falling edge of the drive current of the light-emitting circuit;
a second arithmetic circuit for computing a time difference between the rising and falling edges of the drive current; and
a third comparator for comparing outputs from the first and second arithmetic circuits with each other to feed back the comparison result to the bias circuit.

8. A laser diode driver comprising:
a light-emitting circuit;
a drive circuit for driving the light-emitting circuit;
a bias circuit for adding a bias current to a pulse current outputted from the drive circuit;
a light-receiving circuit for receiving monitoring light outputted from the light-emitting circuit;
an I/V conversion circuit for subjecting an output from the light-receiving circuit to current-to-voltage conversion;
a maximum-value detection circuit for detecting the maximum value of an output voltage of the I/V conversion circuit;
a duty detection circuit for detecting the duty ratio of the output voltage of the I/V conversion circuit to feed back the detected duty ratio to the bias circuit; and
a comparator for comparing the maximum value with a first reference value to feed back the comparison result to the drive circuit.

9. The laser diode driver of claim 8, wherein the duty detection circuit includes a charge pump circuit for receiving the output voltage of the I/V conversion circuit.

10. The laser diode driver of claim 8, wherein the duty detection circuit includes:
two average-value detection circuits for detecting the respective average values of the non-inverted and inverted output voltages of the I/V conversion circuit, and
a comparator for comparing outputs from the average-value detection circuits with each other to feed back the comparison result to the bias circuit.

11. The laser diode driver of claim 10, wherein the average-value detection circuits each include a low-pass filter circuit.

* * * * *